United States Patent
Takahashi

(10) Patent No.: US 8,058,919 B2
(45) Date of Patent: Nov. 15, 2011

(54) DELAY CIRCUIT

(75) Inventor: Hiroyuki Takahashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 12 days.

(21) Appl. No.: 12/571,660

(22) Filed: Oct. 1, 2009

(65) Prior Publication Data

US 2010/0090741 A1    Apr. 15, 2010

(30) Foreign Application Priority Data

Oct. 9, 2008  (JP) ................................. 2008-262915

(51) Int. Cl.
*H03H 11/26* (2006.01)

(52) U.S. Cl. ........................................ 327/261; 327/284

(58) Field of Classification Search .................. 327/261, 327/284
See application file for complete search history.

(56) References Cited

U.S. PATENT DOCUMENTS

| | | | |
|---|---|---|---|
| 5,428,244 A * | 6/1995 | Segawa et al. ................. | 257/646 |
| 6,287,988 B1 * | 9/2001 | Nagamine et al. ............. | 438/770 |
| 6,725,436 B2 * | 4/2004 | Koike et al. .................... | 338/308 |
| 7,049,680 B2 * | 5/2006 | Ikeda et al. ..................... | 257/536 |
| 2002/0137336 A1 * | 9/2002 | Won ................................ | 438/683 |
| 2002/0176315 A1 * | 11/2002 | Graaff ............................. | 365/233 |
| 2007/0061536 A1 * | 3/2007 | Ivanov ............................ | 711/167 |
| 2009/0179677 A1 * | 7/2009 | Augustyniak .................. | 327/165 |
| 2009/0317972 A1 * | 12/2009 | Anderson et al. .............. | 438/630 |

FOREIGN PATENT DOCUMENTS

JP    2002-94002 (A)    3/2002

* cited by examiner

*Primary Examiner* — Lincoln Donovan
*Assistant Examiner* — Ryan Jager
(74) *Attorney, Agent, or Firm* — Foley & Lardner LLP

(57) ABSTRACT

A delay circuit with a delay time being more accurate and a circuit area being reduced is provided. The delay circuit includes a resistance element 3, a capacitor element 4 and a connection wiring 6. The connection wiring 6 includes a first polysilicon layer 13*a* above a substrate 10, and a first silicide layer 14*a* which connects the resistance element 3 and the capacitor element 4 and is on the first polysilicon layer 13*a*. The capacitor element 4 includes a diffusion layer 12*b* in the surface region of the semiconductor substrate 10, a gate insulating layer 15*b* on the diffusion layer 12*b*, a second polysilicon layer 13*b* on the gate insulating layer 15*b*, and a second silicide layer 14*b* on the second polysilicon layer 13*b*. The resistance element 3 includes a third polysilicon layer 13*c* above the semiconductor substrate 10. The first, second and third polysilicon layers 13*a*, 13*b* and 13*c* are integrally provided. The first and second silicide layers 14*a* and 14*b* are integrally provided.

7 Claims, 5 Drawing Sheets

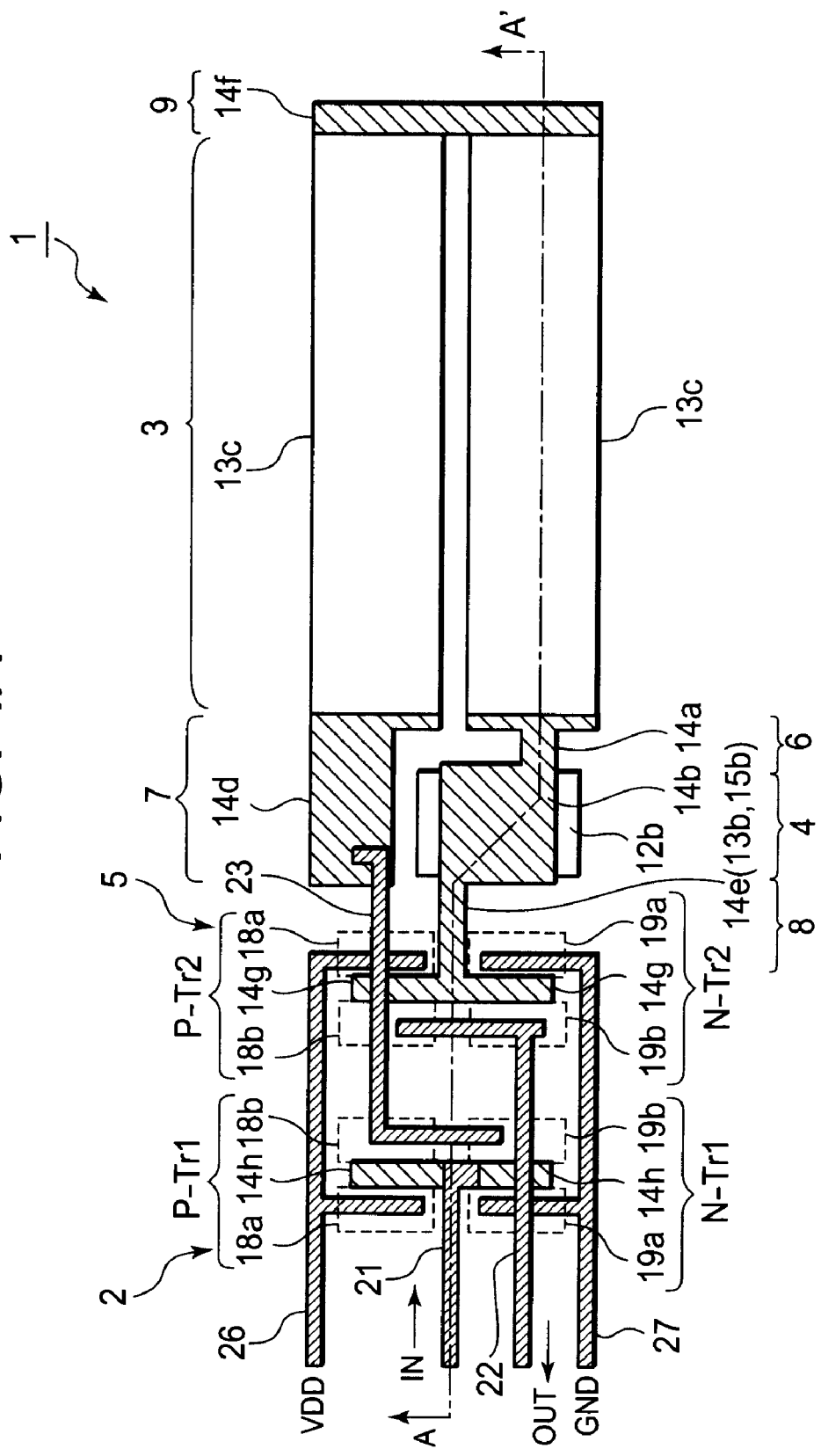

DELAY CIRCUIT

CROSS-REFERENCE TO RELATED APPLICATIONS

The present application is based upon and claims the benefit from prior Japanese Application No. 2008-262915 filed Oct. 9, 2008, the entire contents of which is incorporated herein by reference.

BACKGROUND OF THE INVENTION

1. Field of the Invention

The present invention relates to a delay circuit, and particularly relates to a delay circuit for use in a semiconductor integrated circuit.

2. Description of the Related Art

In a semiconductor integrated circuit (including a semiconductor memory), a delay circuit which delays a signal by a desired time is used for regulating the timing of propagation of the signal. A delay circuit is generally configured by an inverter, a resistance element, a capacitor element and the like. As a result of enhancement in the operation speed in semiconductor integrated circuits of recent years, extremely high precision is required in regulation of delay times. Therefore, delay circuits need to be manufactured with higher precision so as to obtain more accurate delay times. Further, by microfabrication of a semiconductor integrated circuit, reduction in the circuit area of a delay circuit, and suppression of influence on metal restriction are demanded.

As a related art, Japanese Patent Laid-Open No. 2002-94002 discloses a semiconductor device. The semiconductor device includes a signal line, and a capacitor element and a resistance element which are connected to the signal line. This semiconductor device is characterized in that a part or whole of the resistance element configures a part of the capacitor element. The capacitor element and the resistance element function as a delay circuit. The capacitor element may be an MIS capacitance. The resistance element may be formed from a wiring layer used as a gate of an MIS transistor. The resistance element may be formed from a polysilicon layer. The capacitance value of the capacitor element and the resistance value of the resistance element may be physically or electrically variable. Japanese Patent Laid-Open No. 2002-94002 describes that by the semiconductor device, the layout area of the delay circuit can be reduced.

However, it has been found out by the study of the inventor that the technique of Japanese Patent Laid-Open No. 2002-94002 has the following problem. FIG. 1 is a schematic sectional view schematically showing the configuration of the semiconductor device of Japanese patent Laid-Open No. 2002-94002. In this art, a diffusion layer 112 is provided in a well 111 on a semiconductor substrate 110, and a gate wiring layer (polysilicon layer) 113 is provided on the diffusion layer 112 via a gate insulating film 115. More specifically, a capacitor element (C) configured by the gate wiring layer 113, the gate insulating film 115 and the diffusion layer 112, and a resistance element (R) configured by the gate wiring layer 113 continuously configure the delay circuit 101. FIG. 2 is a circuit diagram showing the equivalent circuit of FIG. 1. In the delay circuit 101, C1 can charge and discharge electricity from and to R1, and Cn can charge and discharge electricity from and to Rn (n is a natural number). However, Co charges and discharges to and from an impedance component in an inverter INV1. More specifically, a transistor in the inverter INV1 relates to charge and discharge. However, in a transistor, variation easily occurs to the impedance component due to the influence of voltage, temperature, a production error and the like as compared with a normal capacitor element and resistance element of simple structures. Therefore, the delay circuit 101 has difficulty in making the delay time more accurate, and is considered to have a problem of precision.

Further, in order to enhance precision, the resistance element is preferably in a straight-line shape of which size precision can be easily realized. However, the resistance element (gate wiring layer) of Japanese Patent Laid-Open No. 2002-94002 is in a meandering shape. Accordingly, it is considered to be difficult to realize high size precision. Further, in recent years, for the gate wiring layer, the stacked layers of a polysilicon layer and a silicide layer are used instead of only one polysilicon layer. Therefore, it is conceivable that application of such a gate wiring layer to the resistance element of Japanese Patent Laid-Open No. 2002-94002 makes the resistance value too low. Further, if metal wiring coupling noise is on a delay contact point, an error occurs. Therefore, when the metal wiring is used in the delay circuit, there arises the problem of metal wiring restriction which restricts use of the metal wiring in its upper layer. Further, when a metal wiring is used in the delay circuit, there is the problem of the occurring noise easily propagating to the metal wiring.

A delay circuit which provides more accurate delay times is desired. A delay circuit is required, in which the circuit area is reduced, and influence on the metal restriction is suppressed is required. A delay circuit in which noise hardly propagates is desired.

SUMMARY OF THE INVENTION

Means for solving the problem will be described hereinafter by using reference numerals and characters used in the best mode for carrying out the invention. These reference numerals and characters are added by being parenthesized to clarify the correspondence with the description of claims and the best mode for carrying out the invention. However, these reference numerals and characters should not be used for interpretation of the technical scope of the invention described in claims.

A delay circuit of the present invention includes a resistance element (3), a capacitor element (4), and a connection wiring (6). The connection wiring (6) includes a first silicide layer (14a) connecting the resistance element (3) and the capacitor element (4).

In the present invention, as the wiring which connects the resistance element (3) and the capacitor element (4), the first silicide layer (14a) is used, and the metal wiring is not used. More specifically, the resistance element (3), the capacitor element (4) and the connection wiring (6) have no metal wirings. Therefore, in these sections, metal wiring coupling noise is not on the delay contact point. Accordingly, propagation of noise can be suppressed. In addition, the metal wiring can be used in the upper layers of them, and metal wiring restriction can be relieved. Further, the first silicide layer (14a) can be formed by being stacked on the film configuring the resistance element (3) and the capacitor element (4). Accordingly, it is not necessary to form a region for a contact as in the case of using a metal wiring, and the areas of the resistance element (3) and the capacitor element (4) can be reduced. More specifically, the circuit area can be reduced. Further, the resistance element (3) and the capacitor element (4) are connected by the connection wiring (6), and therefore, both of them are individually provided. Accordingly, it is considered that by arranging the resistance element (3) at the side near the input, and by arranging the capacitor element (4) at the side near the output, the transistor in the inverter hardly relates to charge and discharge. Accordingly, the delay time can be made more accurate. More specifically, a highly precise delay circuit can be obtained.

By the present invention, the delay circuit with more accurate delay times can be obtained. The delay circuit with the circuit area being reduced and influence on the metal restriction being suppressed can be obtained. A delay circuit in which noise hardly propagates can be obtained.

BRIEF DESCRIPTION OF THE DRAWINGS

FIG. 4A is a top view showing one example of the configuration of the delay circuit according to the embodiment of the present invention;

DETAILED DESCRIPTION OF THE PREFERRED EMBODIMENT

Figure 1:
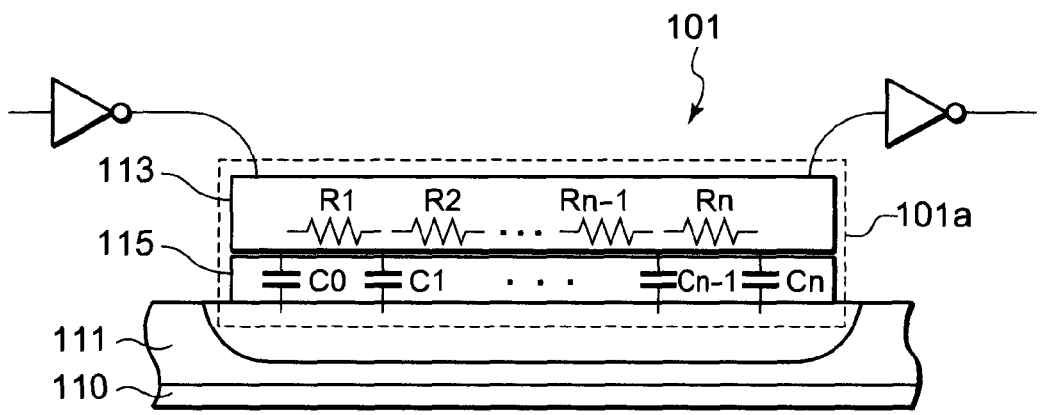
FIG. 1 is a schematic sectional view schematically showing the configuration of a semiconductor device of Japanese Patent Laid-Open No. 2002-94002.
Figure 2:
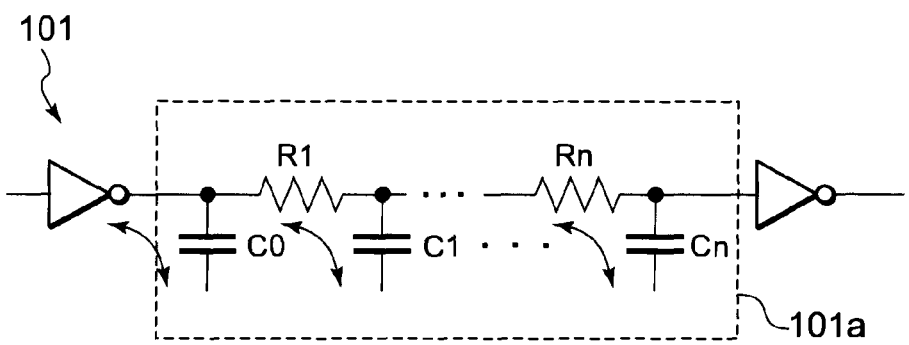
FIG. 2 is a circuit diagram showing an equivalent circuit of FIG. 1.
Figure 3:
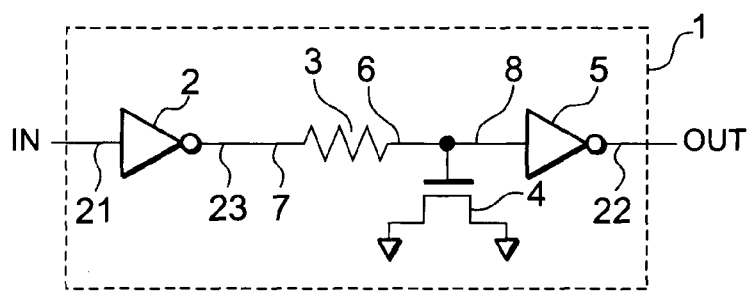
FIG. 3 is a circuit diagram showing the configuration of a delay circuit according to an embodiment of the present invention.

Hereinafter, a delay circuit according to an embodiment of the present invention will be described with reference to the attached drawings. FIG. 3 is a circuit diagram showing the configuration of the delay circuit according to the embodiment of the present invention. A delay circuit 1 includes an inverter 2, a resistance element 3, a capacitor element 4 and an inverter 5.

The inverter 2 has an input side connected to a wiring 21 which is a supply source of a signal, and has an output side connected to a wiring 23 which is an output destination of the signal. The wirings 21 and 23 are exemplified by metal wirings. The resistance element 3 has one end connected to the wiring 23, and the other end connected to a wiring 6. The resistance element 3 is exemplified by a polysilicon layer. The wiring 6 is exemplified by a silicide layer (+ a polysilicon layer). The capacitor element 4 has one end connected to the wirings 6 and 8, and the other end buried in a semiconductor substrate 10 (which will be described later) and grounded. The capacitor element 4 is exemplified by an MOS (MIS) capacitor. The capacitor element 4 is provided in parallel with the resistance element 3. The inverter 5 has an input side connected to the wiring 8 which is a supply source of a signal, and has an output side connected to a wiring 22 which is an output destination of the signal. The wiring 8 is exemplified by a silicide layer (+ polysilicon layer). The wiring 22 is exemplified by a metal wiring.

In the present invention, the resistance element 3 and the capacitor element 4 are individually provided, and the resistance element 3 and the capacitor element 4 are connected in this sequence from the input side. Therefore, charge and discharge are performed between the resistance element 3 and the capacitor element 4, and the transistor in the inverter is not considered to be related to charge and discharge. Accordingly, a variation does not occur to the impedance component due to the influence of a voltage, temperature, a production error and the like, and delay times can be made more accurate and made as designed. That is to say, a highly precise delay circuit can be obtained.

Figure 4B:
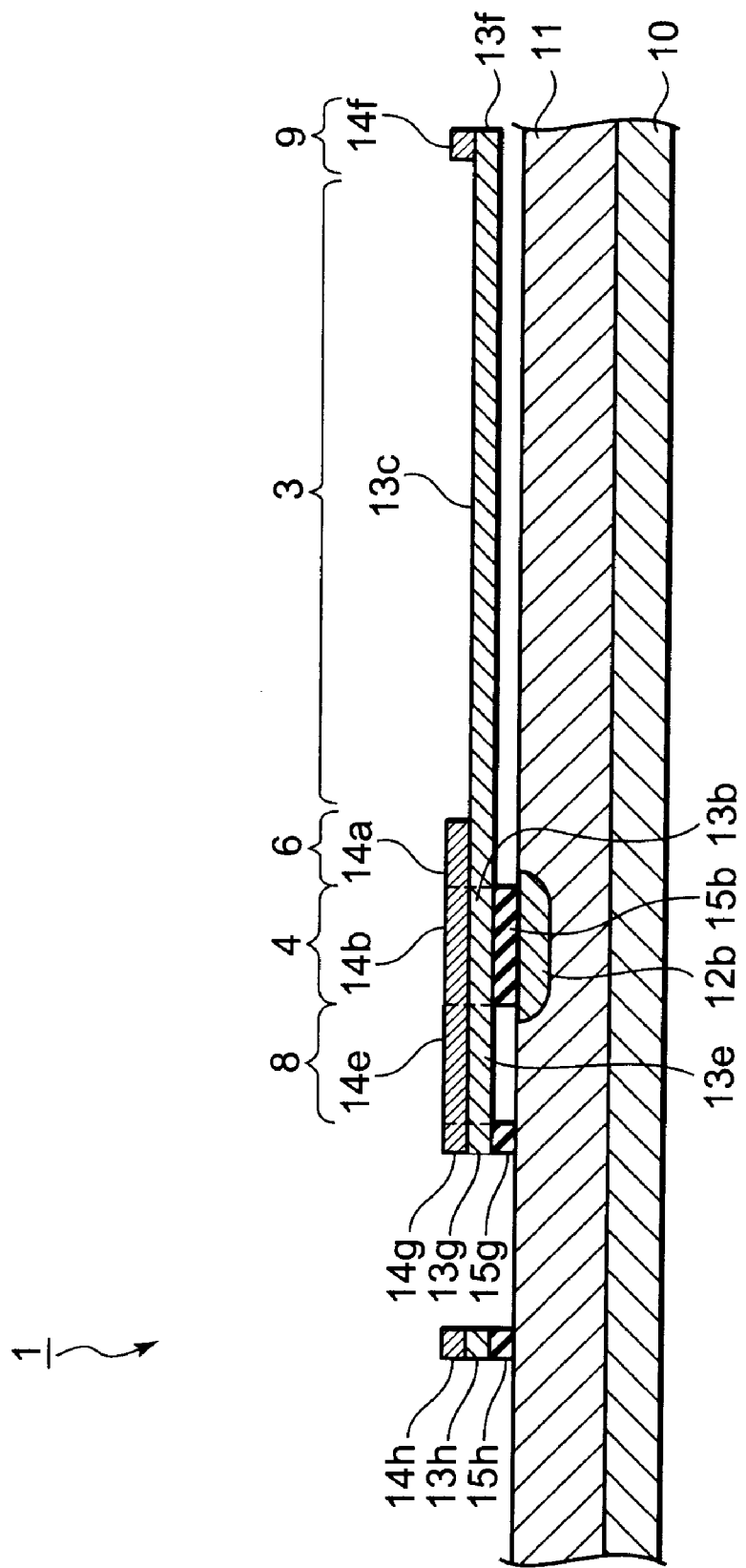
FIG. 4B is a sectional view showing one example of the configuration of the delay circuit according to the embodiment of the present invention.

FIGS. 4A and 4B are schematic diagrams showing one example of the configuration of the delay circuit according to the embodiment of the present invention. FIG. 4A is a top view, and FIG. 4B is a sectional view taken along the line A to A' in FIG. 4A.

The inverter 2 is configured by a PMOS transistor P-Tr1 and an NMOS transistor N-Tr1. In the PMOS transistor P-Tr1, a source side diffusion layer 18a is connected to a metal wiring 26 which is a supply source of a power supply voltage VDD, a drain side diffusion layer 18b is connected to a metal wiring 23 at an output side, and a gate is connected to a wiring 21 which is a supply source of a signal. The diffusion layers 18a and 18b are provided in a surface region (of the well 11) of the semiconductor substrate 10. The gate has a stacked structure of a polysilicon layer 13h and a silicide layer 14h which are provided on the semiconductor substrate 10 via a gate insulating layer 15h. In the NMOS transistor N-Tr1, a source side diffusion layer 19a is connected to a metal wiring 27 which is a supply source of a ground voltage GND, a drain side diffusion layer 19b is connected to the metal wiring 23 at the output side, and a gate is connected to the wiring 21 which is the supply source of a signal. The diffusion layers 19a and 19b are provided in the surface region of the semiconductor substrate 10. The gate has a stacked structure of the polysilicon layer 13h and the silicide layer 14h which are provided over the semiconductor substrate 10 via the gate insulating layer 15h. In the present invention, the layout configuration of the inverter 2 is not limited to this example.

The metal wiring 23 is connected to one end of the wiring 7. The wiring 7 is configured by a polysilicon layer 13d (not illustrated) provided above the semiconductor substrate 10, and a silicide layer 14d which is provided on the polysilicon layer 13d. The silicide layer 14d is exemplified by a tungsten silicide layer. The wiring 7 has the other end connected to the resistance element 3. A signal is considered to flow mainly in the silicide layer 14d with a low resistance.

The resistance element 3 is configured by a polysilicon layer 13c which is provided above the semiconductor substrate 10. One end of the resistance element 3 is connected to the wiring 7, and the other end is connected to the wiring 6. The polysilicon layer 13c and the polysilicon layer 13d of the wiring 7 are formed continuously (integrally) in the same layer. The size (film thickness×width×length) of the polysilicon layer 13c is determined based on the resistance value required from the resistance element 3, for example. However, the resistivity of the polysilicon layer 13c is set by the relationship with the other element, for example.

In the example of the drawing, in the resistance element 3, rectangular two polysilicon layers 13c are arranged parallel with each other, and are connected in series by an internal wiring 9. Thereby, the resistance element 3 has a meandering shape as a whole, but it is avoided that the polysilicon layer 13c having the function as the resister element is in a meandering shape. Like this, the polysilicon layer 13c is formed into a straight line shape, and thereby, the size precision can be made higher. However, the internal wiring 9 is configured by a polysilicon layer 13f provided above the semiconductor substrate 10, and a silicide layer 14f provided on the polysilicon layer 13f. The polysilicon layer 13f and the polysilicon layer 13c are continuously (integrally) formed in the same layer. Further, the silicide layer 14f and the silicide layer 14d of the wiring 7 are formed in the same layer.

Likewise, a plurality of (equal to three or larger) rectangular polysilicon layers 13c may be arranged parallel with one another, and may be connected in series by the internal wiring 9. Thereby, regulation for making the delay time in the delay circuit 1 long can be performed. Further, the number of the rectangular polysilicon layers 13c may be one. In this case, the internal wiring 9 can be extended to be integrated with the wiring 6. Thus, regulation to shorten the delay time in the delay circuit 1 can be performed.

The wiring 6 is configured by a polysilicon layer 13a provided above the semiconductor substrate 10, and a silicide layer 14a provided on the polysilicon layer 13a. The wiring 6 has one end connected to the resistance element 3, and the other end connected to the capacitor element 4. The silicide layer 14a is exemplified by a tungsten silicide layer. A signal is considered to flow mainly in the silicide layer 14a with a low resistance. The polysilicon layer 13a and the polysilicon layer 13c of the resistance element 3 are continuously (integrally) formed in the same layer. Further, the silicide layer 14a and the silicide layer 14d of the wiring 7 are formed in the same layer.

The capacitor element 4 has a MOS capacitor structure, and is configured by a diffusion layer 12b provided in the surface region (of the well 11) of the semiconductor substrate 10, a gate insulating layer 15b provided on the diffusion layer 12b, a polysilicon layer 13b provided on the gate insulating layer 15b, and a silicide layer 14b provided on the polysilicon layer 13b. The silicide layer 14b is connected to the wiring 6 and the wiring 8. The diffusion layer 12b (source/drain) is grounded. A gate insulating layer 15b and the gate insulating layer 15h are formed in the same layer. The polysilicon layer 13b and the polysilicon layer 13a are continuously (integrally) formed in the same layer. The silicide layer 14b and the silicide layer 14a of the wiring 6 are formed continuously (integrally) in the same layer.

The wiring 8 is configured by a polysilicon layer 13e provided above the semiconductor substrate 10, and a silicide layer 14e provided on the polysilicon layer 13e. The wiring 8 has one end connected to the capacitor element 4, and has the other end connected to the inverter 5. The silicide layer 14e is exemplified by a tungsten silicide layer. A signal is considered to flow mainly in the silicide layer 14e with a low resistance. The polysilicon layer 13e and the polysilicon layer 13b are continuously (integrally) formed in the same layer. The silicide layer 14e and the silicide layer 14b of the wiring 6 are continuously (integrally) formed in the same layer.

The inverter 5 is configured by a PMOS transistor P-Tr2 and an NMOS transistor N-Tr2. In the PMOS transistor P-Tr2, the source side diffusion layer 18a is connected to the metal wiring 26 which is a supply source of the power supply voltage VDD, the drain side diffusion layer 18b is connected to a metal wiring 22 at the output side, and a gate is connected to the wiring 8 which is a supply source of signal. The diffusion layers 18a and 18b are provided in the surface region (of the well 11) of the semiconductor substrate 10. The gate has a stacked structure of a polysilicon layer 13g and a silicide layer 14g which are provided over the semiconductor substrate 10 via a gate insulating layer 15g. In the NMOS transistor N-Tr2, the source side diffusion layer 19a is connected to the metal wiring 28 which is a supply source of the ground voltage GND, the drain side diffusion layer 19b is connected to the metal wiring 22 at the output side, and the gate is connected to the wiring 8 which is a supply source of a signal. The diffusion layers 19a and 19b are provided in the surface region of the semiconductor substrate 10. The gate has a stacked structure of a polysilicon layer 13g and a silicide layer 14g which are provided over the semiconductor substrate 10 via a gate insulation layer 15g. In the present invention, the layout configuration of the inverter 5 is not limited to this example.

The delay circuit according to the present embodiment is manufactured as follows, for example.

First, by the techniques of photolithography and ion injection, the diffusion layer 12b is formed in a predetermined region. Next, one gate insulating layer 15 is deposited above the semiconductor substrate 10. Here, the gate insulating layer 15 is exemplified by a silicon oxide film. Subsequently, one polysilicon layer 13 is deposited. Thereafter, by the techniques of photolithography and etching, the polysilicon layer 13 and the gate insulating layer 15 are etched into predetermined shapes. Thereby, the gate insulating layers 15b, 15g and 15h are formed, and the polysilicon layers 13a, 13b, 13c, 13d, 13e, 13f, 13g and 13h are formed. Thereafter, by the techniques of photolithography and ion injection, the diffusion layers 18a, 18b, 19a and 19b are formed in the predetermined regions. Next, a metal film is deposited on the entire surface above the semiconductor substrate 10. At this time, the metal film is deposited with a mask being put on at least the polysilicon layer 13c so that a silicide layer is not formed on at least the polysilicon layer 13c (silicide block). The metal film is exemplified by a tungsten film. Thereafter, the silicide layers 14a, 14b, 14d, 14e, 14f, 14g and 14h are formed by causing the metal film and each of the polysilicon layers by thermal treatment. Thereafter, an unnecessary metal film is removed.

In the present invention, as the wiring 6 which connects the resistance element 3 and the capacitor element 4, a silicide layer is used, but the metal wiring is not used. Specifically, the resistance element 3, the capacitor element 4 and the wiring 6 all do not have a metal wiring. Therefore, in the sections of them, metal wiring coupling noise is not on the delay contact point. Therefore, propagation of noise can be suppressed. In addition, the metal wiring can be used in the upper layers of them, and metal wiring restriction can be relieved. In the example of FIG. 4, a metal wiring is not used in most parts of the resistance element 3 (including the connection wiring 9), the wiring 6 and the wiring 7, and the region of the capacitor element 4. Accordingly, metal wiring restriction can be eliminated in the upper layers of them, and metal wiring can be freely made on the upper layers.

Avoidance of use of the metal wiring as described above can be realized by integrally and continuously forming the polysilicon layer 13c of the resistance element 3, the polysilicon layers 13a and 13d of the wirings 6 and 7, and the polysilicon layer 13b of the capacitor element 4, and by integrally and continuously forming the silicide layers 14a and 14d of the wirings 6 and 7, and the silicide layer 14b of the capacitor element 4 while preventing formation of the silicide layer on the polysilicon layer 13c of the resistance element 3 by a silicide block.

Further, in the present invention, the gate insulating layers 15b, 15g and 15h, the polysilicon layers 13a, 13b, 13c, 13d, 13e, 13f, 13g and 13h, the diffusion layers 12b, 18a, 18b, 19a and 19b, and the silicide layers 14a, 14b, 14d, 14e, 14f, 14g and 14h are formed in the same process. Therefore, the delay circuit can be manufactured without substantially adding any process step for the resistance element 3 and the capacitor element 4.

Further, in the present invention, the silicide layer 14a can be formed by being stacked on the polysilicon layer 13a which is integral and continuous with the polysilicon layer configuring the resistance element 3 and the capacitor element 4. Accordingly, it is not necessary to form the region for a contact as in the case of using a metal wiring, and the areas of the resistance element 3 and the capacitor element 4 can be reduced. More specifically, since metal wirings are used for only the inverters 2 and 5, the region for a contact can be reduced, and the circuit area can be reduced.

Further, the resistance element 3 and the capacitor element 4 are individually provided, and therefore, by disposing the resistance element 3 at the side near the input and disposing the capacitor element 4 at the side near the output, the transistor in the inverter 2 does not relate to charge and discharge. As a result, occurrence of variation to the impedance component due to the influence of a voltage, temperature, a production error and the like can be prevented. Further, the resistance element 3 is formed into a rectangular shape, and is in a straight line shape, and therefore, size precision can be enhanced more. Accordingly, the delay time can be made more accurate. More specifically, the delay circuit with high precision can be obtained.

Figure 5:
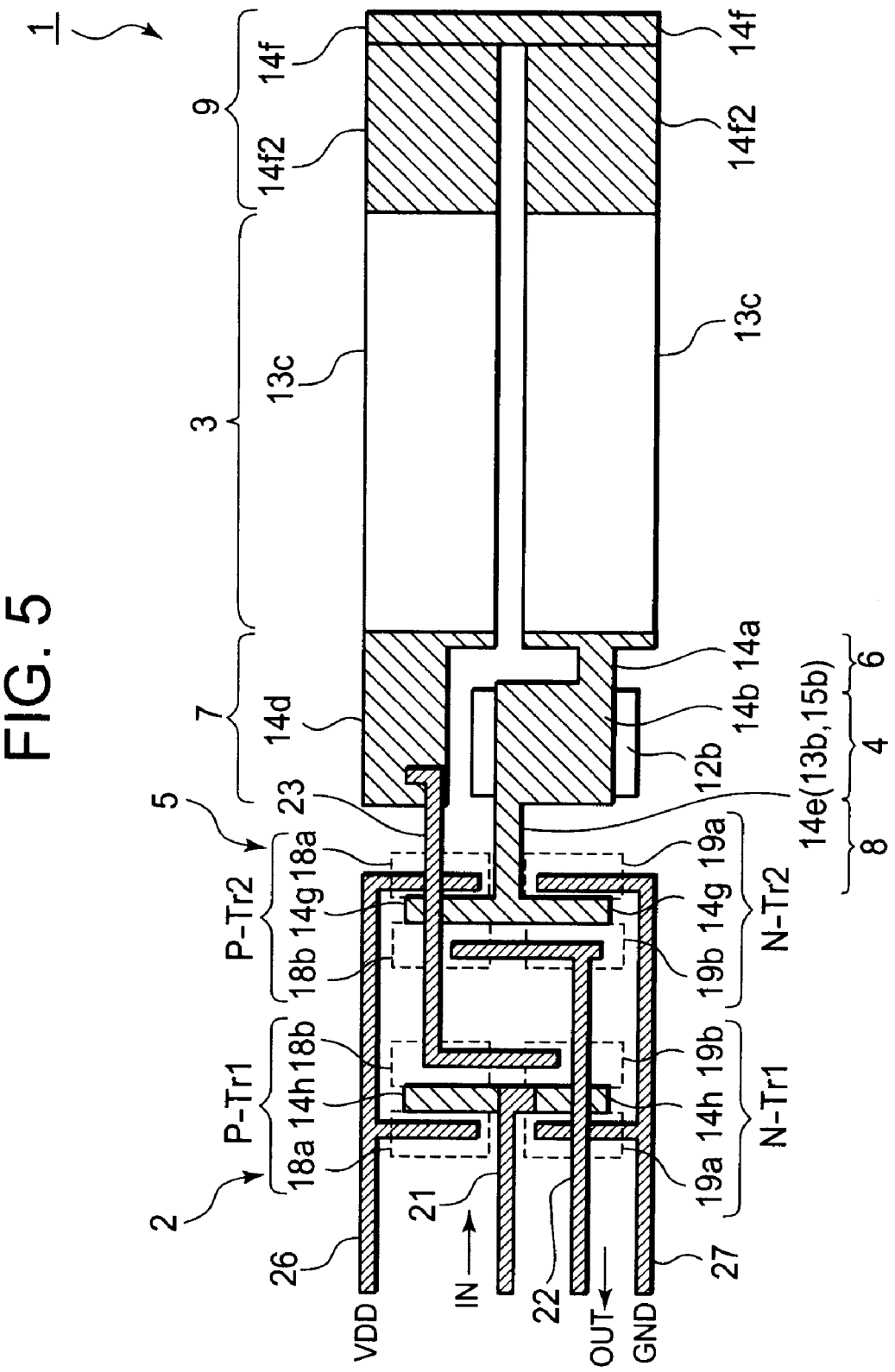
FIG. 5 is a top view showing another example of the configuration of the delay circuit according to the embodiment of the present invention.

In the present embodiment, the resistance value of the resistance element 3 shown in FIG. 4A is set in the shape of the polysilicon layer 13c. Here, the delay time of the delay circuit 1 can be changed in accordance with a desired delay time with the basic shape of the delay circuit 1 being kept unchanged. FIG. 5 shows one example of it. FIG. 5 is a top view showing another example of the configuration of the delay circuit according to the embodiment of the present invention. As shown in FIG. 5, the internal wiring 9 has a silicide layer 14f2 in addition to a silicide layer 14f. As compared with FIG. 4A, the area of the polysilicon layer 13c, which is covered with the silicide layers 14f and 14f2, is large. Thereby, the resistance value of the resistance element 3 becomes small. As a result, the delay time of the delay circuit 1 can be made short. In the drawing, the two silicide layers 14f2 have the same sizes, but may have different sizes.

Figure 6:
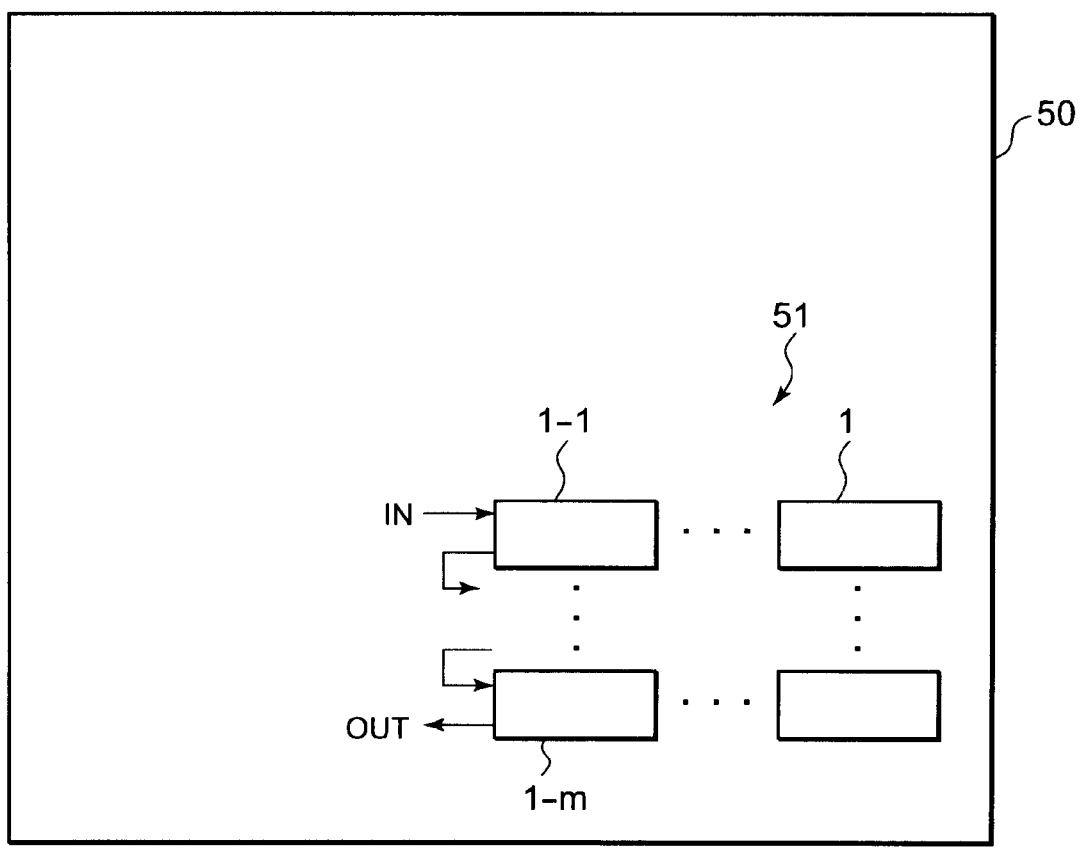
FIG. 6 is a schematic view showing a semiconductor device according to the embodiment of the present invention.

Next, a semiconductor device according to the embodiment of the present invention will be described. FIG. 6 is a schematic view showing a semiconductor device according to the embodiment of the present invention. A semiconductor device 50 is exemplified by a semiconductor large-scale integrated circuit (LSI), a system LSI, a semiconductor memory and the like. Here, illustration other than the delay circuit is omitted. The semiconductor device 50 includes a plurality of delay circuits 1 which delay a signal by a desired time in order to regulate timing of propagation of the signal. The delay circuit 1 described in FIGS. 3 to 5 can be used. As the delay circuit, the delay circuit 1 may be individually used. Alternatively, as illustrated, a plurality of delay circuits 1-1 to 1-m (m is a natural number) can be used by being connected in series in accordance with a desired delay time. The area of one delay circuit 1 is reduced, and the delay time becomes more precise. Therefore, when a plurality of these delay circuits 1-1 to 1-m are used, the area is reduced as a whole, and the delay times can be made more precise.

In the present invention, a plurality of delay circuits 1 each in a predetermined shape, which generate delay times of predetermined unit times can be provided in advance at a time of design. Thereby, in accordance with a desired delay time, a necessary number of delay circuits 1 are selected from the plurality of delay circuits 1, and they can be connected in series. Thereby, design of the delay circuit in the semiconductor device is facilitated. Further, after manufacture, a plurality of delay circuits 1 each in a predetermined shape are provided in advance, and are made selectable afterwards by a fuse and a program element, whereby a required number of delay circuits 1 can be connected in series in accordance with a desired delay time. Thereby, the delay circuit can be regulated afterwards, and a more precise delay time can be obtained.

Further, a plurality of delay circuits 1 are arranged in the same manner, and thereby, the upper layers of the resistance elements 3, the capacitor elements 4 and the connection wirings 6 of a plurality of delay circuits 1 can be made the region without metal restriction. Thereby, even though a plurality of delay circuits 1 are disposed, and an area of a certain size is occupied, reduction in the degree of freedom of the metal wiring in these upper layers can be suppressed.

The present invention is not limited to the above described embodiment, and it is clear that the embodiment can be properly modified or changed within the scope of the technical idea of the present invention.

What is claimed is:

1. A delay circuit, comprising:
a resistance element;
a capacitor element; and
a connection wiring including a first silicide layer connecting said resistance element and said capacitor element,
wherein said connection wiring further includes
a first polysilicon layer provided above a semiconductor substrate,
said first silicide layer being provided on said first polysilicon layer,
said capacitor element includes:
a diffusion layer provided in a surface region of said semiconductor substrate,
a gate insulating layer provided on said diffusion layer,
a second polysilicon layer provided on said gate insulating layer, and
a second silicide layer provided on said second polysilicon layer, said resistance element includes
a third polysilicon layer provided above said semiconductor substrate,
said first polysilicide layer, said second polysilicide layer, and said third polysilicon layer are integrally provided, and
said first silicide layer and said second silicide layer are integrally provided.

2. The delay circuit according to claim 1,
wherein said resistance element, said capacitor element and said connection wiring are regions without upper layer metal restriction.

3. The delay circuit according to claim 1, further comprising:
a first inverter circuit provided at an input side;
a first wiring which connects said first inverter circuit and said resistance element;
a second inverter circuit provided at an output side; and
a second wiring which connects said second inverter circuit and said capacitor element,
wherein said first wiring includes a fourth silicide layer which connects to said resistance element, and
said second wiring includes a fifth silicide layer which connects to said capacitor element.

4. The delay circuit according to claim 3,
wherein said first wiring further includes
a fourth polysilicon layer provided integrally with said third polysilicon layer,
said fourth silicide layer being provided on said fourth polysilicon layer,
said second wiring further includes
a fifth polysilicon layer provided integrally with said second polysilicon layer, said fifth silicide layer being provided on said fifth polysilicon layer integrally with said second silicide layer, and said fourth silicide layer is provided in the same layer as said fifth silicide layer.

5. The delay circuit according to claim 1,
wherein said resistance element includes
a seventh silicide layer provided to cover part of said third polysilicon layer, and
said seventh silicide layer is provided in the same layer as said first silicide layer, and a resistance value of said resistance element is set based on an area covering said third polysilicon layer.

6. The delay circuit according to claim 1,
wherein said resistance element is in a rectangular shape.

7. The delay circuit according to claim 6,
wherein said resistance element includes
a plurality of rectangular parts, and
an internal wiring including a sixth silicide layer connecting respective said plurality of rectangular parts in series to one another, and
said sixth silicide layer is provided in the same layer as said first silicide layer.

* * * * *